United States Patent
Labonte et al.

(10) Patent No.: US 8,007,675 B1
(45) Date of Patent: Aug. 30, 2011

(54) SYSTEM AND METHOD FOR CONTROLLING AN ETCH PROCESS FOR A SINGLE CRYSTAL HAVING A BURIED LAYER

(75) Inventors: Andre P. Labonte, Lewiston, ME (US); Craig Richard Printy, Buxton, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 374 days.

(21) Appl. No.: 11/178,557

(22) Filed: Jul. 11, 2005

(51) Int. Cl.
*C03C 25/68* (2006.01)

(52) U.S. Cl. .......................... 216/62; 438/14

(58) Field of Classification Search .................. None
See application file for complete search history.

(56) References Cited

U.S. PATENT DOCUMENTS

| | | | | |
|---|---|---|---|---|
| 4,601,779 | A * | 7/1986 | Abernathey et al. | 438/459 |
| 5,024,723 | A * | 6/1991 | Goesele et al. | 438/459 |
| 5,310,451 | A * | 5/1994 | Tejwani et al. | 438/459 |
| 5,414,276 | A * | 5/1995 | McCarthy | 257/57 |
| 5,462,883 | A * | 10/1995 | Dennard et al. | 438/459 |
| 5,476,813 | A * | 12/1995 | Naruse | 438/311 |
| 5,882,987 | A * | 3/1999 | Srikrishnan | 438/458 |
| 6,110,794 | A * | 8/2000 | Liu | 438/407 |
| 6,455,398 | B1 * | 9/2002 | Fonstad et al. | 438/459 |
| 6,524,935 | B1 * | 2/2003 | Canaperi et al. | 438/478 |
| 6,682,981 | B2 * | 1/2004 | Leedy | 438/342 |
| 6,690,043 | B1 * | 2/2004 | Usuda et al. | 257/194 |
| 6,703,688 | B1 * | 3/2004 | Fitzergald | 257/616 |
| 6,890,835 | B1 * | 5/2005 | Chu et al. | 438/458 |
| 7,001,826 | B2 * | 2/2006 | Akatsu et al. | 438/458 |
| 7,078,353 | B2 * | 7/2006 | Daval et al. | 438/763 |
| 2001/0003269 | A1 * | 6/2001 | Wu et al. | 117/94 |
| 2002/0168864 | A1 * | 11/2002 | Cheng et al. | 438/725 |
| 2003/0003739 | A1 * | 1/2003 | Butschke et al. | 438/689 |
| 2003/0160300 | A1 * | 8/2003 | Takenaka et al. | 257/536 |
| 2003/0183937 | A1 * | 10/2003 | Gates et al. | 257/760 |
| 2004/0000268 | A1 * | 1/2004 | Wu et al. | 117/94 |
| 2004/0009649 | A1 * | 1/2004 | Kub et al. | 438/459 |
| 2004/0053477 | A1 * | 3/2004 | Ghyselen et al. | 438/465 |
| 2004/0175955 | A1 * | 9/2004 | Haselden et al. | 438/757 |
| 2004/0259324 | A1 * | 12/2004 | Brask et al. | 438/455 |
| 2006/0240583 | A1 * | 10/2006 | Baney et al. | 438/22 |

OTHER PUBLICATIONS

Tillack et al., Monitoring of deposiiton and dry etching of Si/SiGe multiple stacks, J. Vac. Sci. Technol. B 14(1), pp. 102-105, Jan./Feb. 1996.*

* cited by examiner

*Primary Examiner* — Allan Olsen

(57) ABSTRACT

A system and method is disclosed that terminates an etch process of a semiconductor crystal material at a precisely located depth. The semiconductor crystal is made of a first material and has a buried layer of a second material that is stoichiometrically different than the first material. The buried layer is located at a depth in the first material at which it is desired to terminate the etch process. During the etch process an optical emission spectrum of the first material is monitored. The intensity of the spectrum decreases when the etch process reaches the second material of the buried layer. The etch process is terminated when the decrease in spectrum intensity is detected.

20 Claims, 4 Drawing Sheets

SYSTEM AND METHOD FOR CONTROLLING AN ETCH PROCESS FOR A SINGLE CRYSTAL HAVING A BURIED LAYER

TECHNICAL FIELD OF THE INVENTION

The present invention relates generally to the manufacture of integrated circuits and, more particularly, to a system and method for controlling an etch process for a single crystal having a buried layer.

BACKGROUND OF THE INVENTION

Mask and etch processes are commonly used during the manufacture of semiconductor wafers for integrated circuits. A patterned resist mask is applied to the surface of a layer of material to be etched. An etch process (e.g., a plasma etch) is then applied. The portions of the patterned resist mask that cover the surface of the material prevent the material from being etched when an etch process is applied. The openings through the patterned resist mask allow the etch process to etch the underlying material that is exposed to the etch process. After the etch process is completed the patterned resist mask is removed.

The depth to which the underlying material is etched is determined by the controlling the amount of time that the material is exposed to the etch process. The rate at which the etch process etches the material is known or can be estimated. An etch process that is time controlled is referred to as a timed etch. In a timed etch the etch process is terminated after a predetermined amount of time has elapsed.

It would be advantageous to have a system and method for controlling an etch process for a semiconductor material that is more accurate and precise than a timed etch. There is a need in the art for a system and method that is capable of terminating an etch process of a semiconductor material at a precisely located depth in the etched material.

SUMMARY OF THE INVENTION

To address the above-discussed deficiencies of the prior art, it is a primary object of the present invention to provide a system and method that terminates an etch process of a semiconductor material at a precisely located depth in the etched material.

The system and method of the present invention provides a semiconductor crystal material that is made of a first material (e.g. silicon). The crystal is formed having a buried layer of a second material (e.g. silicon germanium) that is stoichiometrically different than the first material. The second material of the buried layer (silicon germanium) contains a smaller proportion of the first material (silicon) than does the single crystal (which contains only silicon). The second material of the buried layer (silicon germanium) does not affect the electrical properties of the first material (silicon) because germanium is not a donor or acceptor of electrons.

The buried layer is located at a depth in the first material at which it is desired to terminate the etch process. A mask and etch process is then applied to etch the first material of the crystal. The etch process is terminated when it is determined that the etch process has reached the second material of the buried layer.

In one advantageous embodiment of a method of the invention the determination is made that the etch process has reached the second material of the buried layer by monitoring an optical emission spectrum of the first material. During the etch process a photodetector is used to detect the optical emission spectrum of the first material. The photodetector provides the optical emission spectrum to a spectrophotometer. The spectrophotometer monitors the intensity of the optical emission spectrum of the first material during the etch process.

The spectrophotometer detects a decrease in the intensity of the optical emission spectrum of the first material when the etch process reaches the second material of the buried layer. This is because the second material of the buried layer is stoichiometrically different than the first material due to the smaller proportion of first material in the second material of the buried layer.

In another advantageous embodiment of a method of the invention the determination is made that the etch process has reached the second material of the buried layer by detecting particles of the first material that are released during the etch process. A reactant detector unit is used to detect the particles of the first material. The reactant detector unit provides the detected particles to a mass spectrometer. The mass spectrometer monitors the level of the detected particles of the first material during the etch process.

The mass spectrometer detects a decrease in the level of the detected particles of the first material when the etch process reaches the second material of the buried layer. This is because the second material of the buried layer is stoichiometrically different than the first material due to the smaller proportion of first material in the second material of the buried layer.

It is an object of the present invention to provide a system and method that terminates an etch process of a semiconductor material at a precisely located depth in the semiconductor material.

It is also an object of the present invention to provide a method for determining when an etch process of a semiconductor material has reached a buried layer that is precisely located in the semiconductor material.

It is another object of the invention to provide a method for determining when an etch process has reached a precisely located buried layer in a semiconductor material by monitoring and detecting a decrease in an intensity of an optical emission spectrum of the semiconductor material.

It is yet another object of the invention to provide a method for determining when an etch process has reached a precisely located buried layer in a semiconductor material by monitoring and detecting a decrease in a level of particles of the semiconductor material that are released during the etch process.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented for any type of suitably arranged single crystal having a buried layer.

Figure 1:
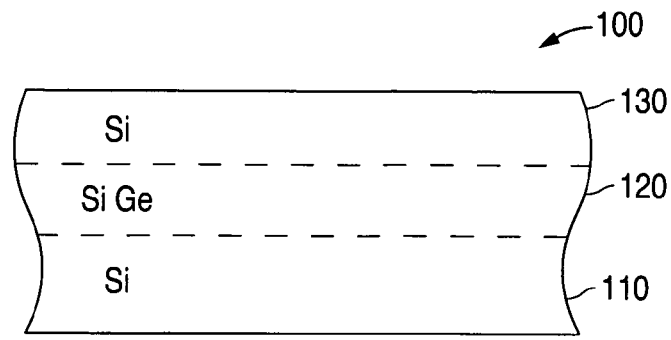
FIG. 1 is a block diagram illustrating a cross sectional view of a silicon crystal having a buried layer made of silicon and germanium.

FIG. 1 is a block diagram 100 illustrating a cross sectional view of a single crystal having a buried layer that is made of stoichiometrically different material. The single crystal that is shown in FIG. 1 is made of silicon. Specifically, the lower layer 110 of the crystal is made of silicon. The buried layer 120 in the crystal is created by placing a silicon germanium layer over the lower layer 110 of the crystal. An upper layer of silicon is then grown epitaxially over the buried layer 120 to create the structure shown in FIG. 1.

The upper surface of the buried layer 120 is located at a depth in the crystal to which it is desired to etch the upper layer 130 of silicon. It is the presence of the germanium in the buried layer 120 that causes the buried layer 120 to be stoichiometrically different from the lower silicon layer 110 and the upper silicon layer 130. The second material (silicon germanium) of the buried layer 120 contains a smaller proportion of the first material (silicon) than does the upper layer 130 of silicon (which is all silicon).

In the illustrative example described in this patent document the elements silicon and germanium have been used to illustrate the principles of the present invention. It is understood that the use of silicon and germanium are exemplary and that the present invention is not limited to the use of silicon and germanium. The system and method of the present invention may also be used with other types of materials. For example, the buried layer 120 may be made of silicon lead or silicon tin. The system and method of the present invention may also be used with any single crystal material.

The material (e.g., germanium, lead, tin) that is used in conjunction with the silicon crystal is an element of Group IV-A of the Periodic Chart of the Elements. An element of Group IV-A is not an electron donor and is not an electron acceptor. For this reason the presence of a Group IV-A element in the silicon in the buried layer 120 does not affect the electrical properties of other portions of the integrated circuit (e.g., the upper layer of silicon 130).

Figure 2:
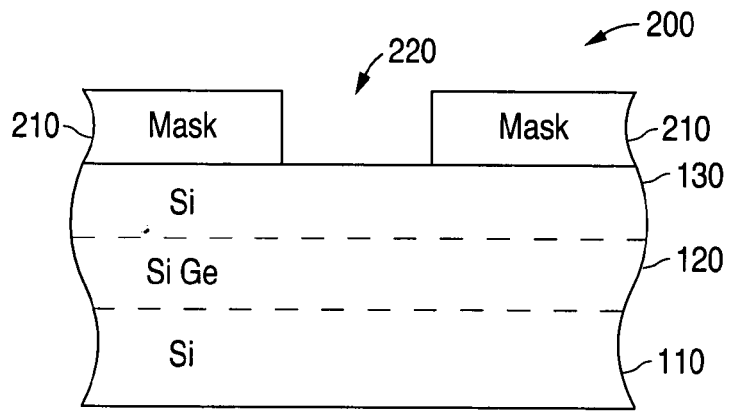
FIG. 2 is a block diagram illustrating a cross sectional view of the silicon crystal shown in FIG. 1 and a patterned resist mask that covers portions of the upper surface of the silicon crystal.

A patterned resist mask is placed over the structure that is shown in FIG. 1. FIG. 2 is a block diagram 200 illustrating a cross sectional view of the structure shown in FIG. 1 together with a patterned resist mask 210 that covers portions of the upper surface of the silicon layer 130. The patterned resist mask 210 is made with portions that form an aperture 220 that allows an etch process (e.g., a plasma etch) to etch the exposed central portion of silicon layer 130.

Figure 3:
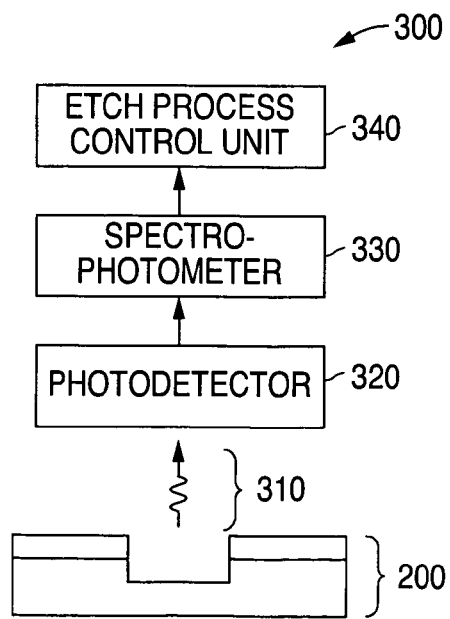
FIG. 3 is a block diagram illustrating an advantageous embodiment of a method of the present invention in which a photodetector and a spectrophotometer are used to monitor an optical emission spectrum during an etch process performed on the silicon crystal shown in FIG. 2.

An etch process is initiated to etch the unmasked portion of silicon layer 130. During the etch process a photodetector and a spectrophotometer are used to monitor the intensity of an optical emission spectra of the silicon that is created during the etch process. FIG. 3 is a block diagram 300 that illustrates an advantageous embodiment of this method of the present invention. Photodetector 320 detects an optical emission spectrum (represented in FIG. 3 by photon 310) of the silicon as the silicon layer 130 is being etched. The photodetector 320 provides the detected optical emission spectrum to spectrophotometer 330. The spectrophotometer 330 monitors the intensity of the optical emission spectrum of the silicon during the etch process.

If the spectrophotometer 330 determines that the intensity of the detected optical emission spectrum of the silicon remains unchanged, then the etch process is continued. Assume that the spectrophotometer 330 detects a decrease in the intensity of the detected optical emission spectrum of the silicon. This means that the etch process has reached the stoichiometrically different material of buried layer 120. The intensity of the detected optical emission spectrum of the silicon is decreased because there is less silicon in the buried layer 120 (because of the presence of the germanium) than there is in the upper layer 130 of silicon. The spectral changes are the result of the differing materials in the buried layer 120 changing the plasma reactants in the etch process.

In this manner the spectrophotometer 330 is capable of determining exactly when the etch process has reached the upper level of buried layer 120. The spectrophotometer then sends a control signal to an etch process control unit 340 to cause etch process control unit 340 to terminate the etch process. This causes the etch process to be terminated at precisely the correct depth within the single crystal.

Figure 4:
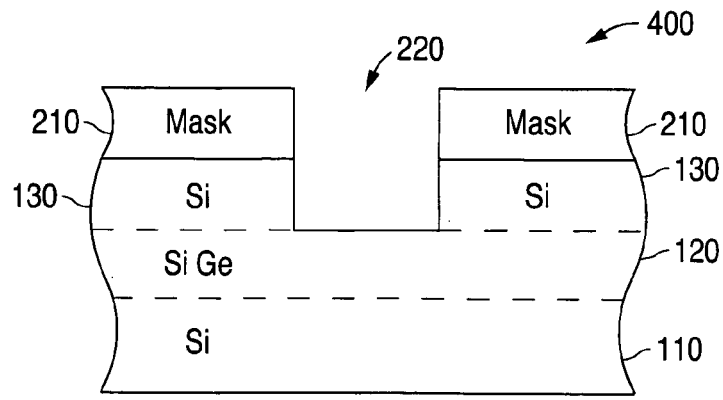
FIG. 4 is a block diagram illustrating a cross sectional view of the silicon crystal shown in FIG. 2 showing the result of an etch process after the etch process has reached the upper surface of the buried layer within the silicon crystal.

FIG. 4 is a block diagram 400 illustrating a cross sectional view of the structure shown in FIG. 2 showing the result of terminating the etch process after the etch process has reached the upper surface of the buried layer 120. Because the etch process is immediately terminated when the buried layer 120 is reached, there is no undesirable etching past the desired depth.

Figure 5:
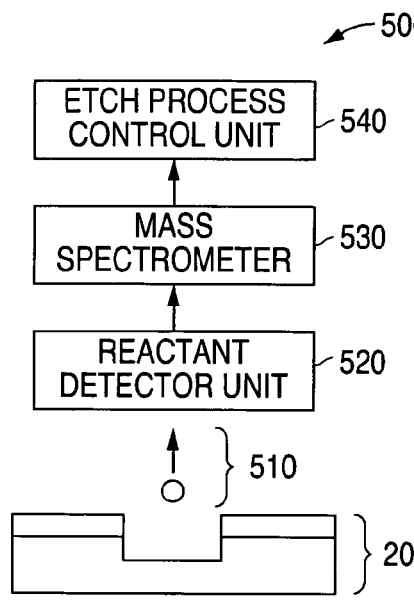
FIG. 5 is a block diagram illustrating an advantageous embodiment of a method of the present invention in which a reactant detector unit and a mass spectrometer are used to monitor the presence of silicon crystal particles during an etch process performed on the silicon crystal shown in FIG. 2.

FIG. 5 is a block diagram 500 illustrating an advantageous embodiment of a method of the present invention in which a reactant detector unit and a mass spectrometer are used to monitor the level of silicon crystal particles that are released during an etch process performed on the silicon crystal.

As in the previously described method, a patterned resist mask 210 is placed over the structure that is shown in FIG. 1. FIG. 2 is a block diagram 200 illustrating a cross sectional view of the structure shown in FIG. 1 together with a patterned resist mask 210 that covers portions of the upper surface of the silicon layer 130. The patterned resist mask 210 is made with portions that form an aperture 220 that allows an etch process (e.g., a plasma etch) to etch the exposed central portion of silicon layer 130.

An etch process is initiated to etch the unmasked portion of silicon layer 130. During the etch process a reactant detector unit and a mass spectrometer are used to detect the level of particles of the silicon that is released during the etch process. Reactant detector unit 520 detects the level of silicon particles (represented in FIG. 5 by circle 510) that are released as the silicon layer 130 is being etched. The reactant detector unit 520 provides the detected level of particles to mass spectrometer 530. The mass spectrometer 530 monitors the level of the silicon particles during the etch process.

If the mass spectrometer 530 determines that the level of silicon particles unchanged, then the etch process is continued. Assume that the mass spectrometer 530 detects a decrease in the level of detected silicon particles. This means that the etch process has reached the stoichiometrically different material of buried layer 120. The level of the detected silicon particles is decreased because there is less silicon in the buried layer 120 (because of the presence of the germanium) than there is in the upper layer 130 of silicon.

In this manner the mass spectrometer 530 is capable of determining exactly when the etch process has reached the upper level of buried layer 120. The mass spectrometer 530 then sends a control signal to an etch process control unit 540 to cause etch process control unit 540 to terminate the etch process. This causes the etch process to be terminated at precisely the correct depth within the single crystal.

Figure 6:
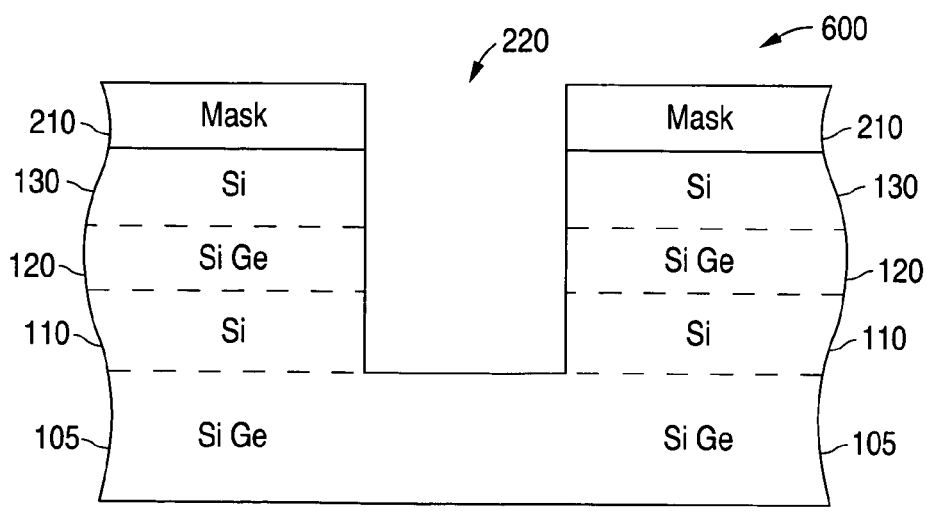
FIG. 6 is a block diagram illustrating a cross sectional view of a silicon crystal showing the result of an etch process after the etch process has reached the top surface of a second buried layer located within the silicon crystal at a location that is lower than that of a first buried layer.

The system and method of the present invention can also be used to etch down to more deeply buried layers in a multi-layer single crystal. For example, FIG. 6 is a block diagram 600 illustrating a cross sectional view of a silicon crystal showing the result of the etch process after the etch process has reached the top surface of a second buried layer 105 located within the silicon crystal at a location that is lower than that of a first buried layer 120.

The etch process is carried out in the same manner as previously described. However, in this case, the etch process control unit 340 (or 540) is made aware of the fact that the detection of the first buried layer 120 is to be ignored. The etch process is to be continued until the second buried layer 105 is detected. The etch process is terminate when the second buried layer 105 is detected.

It is seen from this example that the system and method of the present invention can be used to etch down to one of a plurality of buried layers in a multi-layer single crystal.

Figure 7:
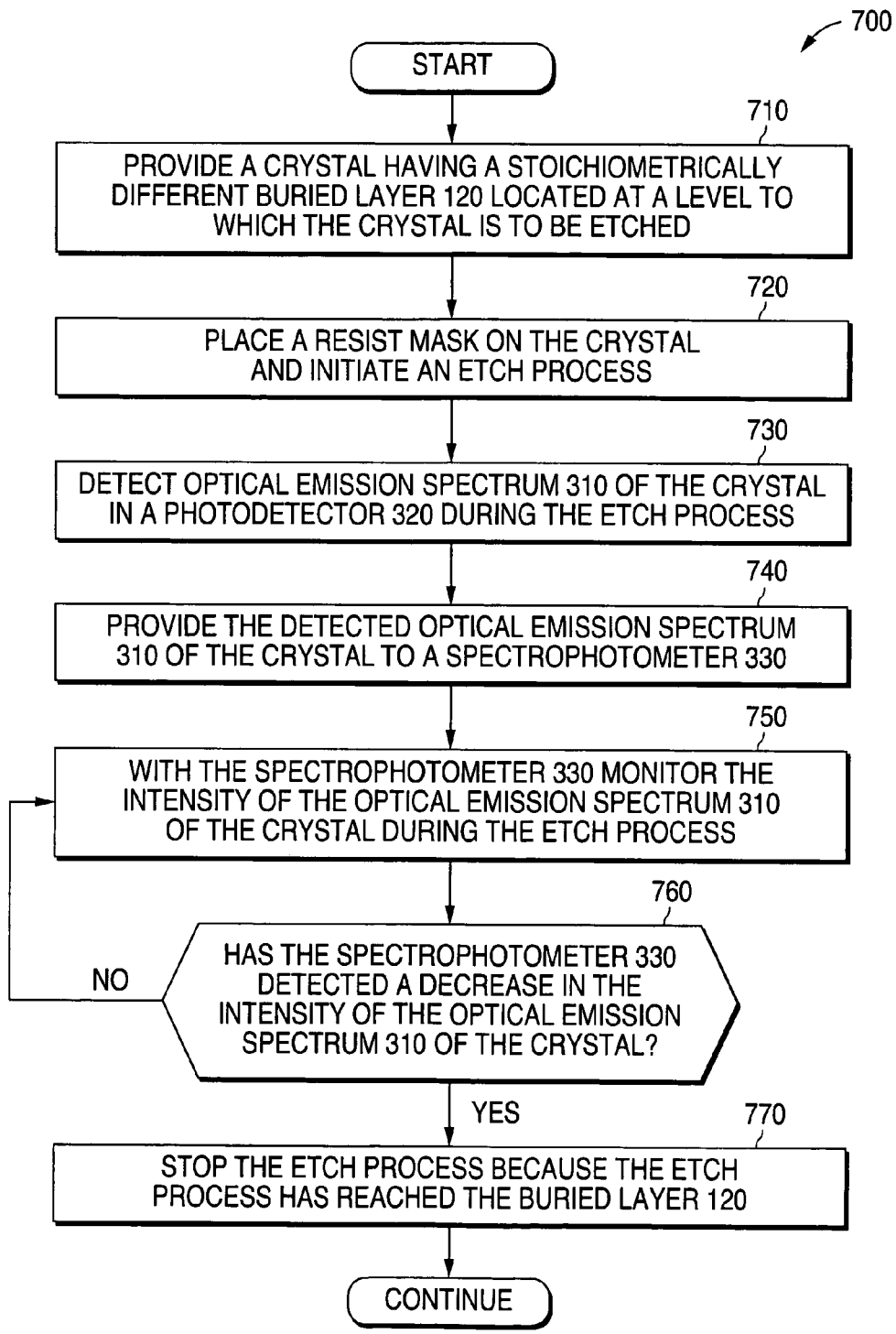
FIG. 7 is a flow chart showing the steps of a first advantageous embodiment of a method of the present invention.

FIG. 7 is a flow chart 700 showing the steps of a first advantageous embodiment of a method of the present invention. In the first step of the method a crystal (e.g., silicon) is provided that has a stoichiometrically different buried layer 120 (e.g., silicon germanium) that is located at a level to which the crystal is to be etched (step 710). Then a resist mask is placed on the crystal and an etch process is initiated (step 720).

During the etch process a photodetector 320 detects the optical emission spectrum of the crystal (step 730). The detected optical emission spectrum is provided to a spectrophotometer 330 (step 740). During the etch process the spectrophotometer 330 monitors the intensity of the detected optical emission spectrum of the crystal (step 750).

If the spectrophotometer 330 detects an unchanged intensity of the detected optical emission spectrum of the crystal, then the etch process is continued ("No" branch of decision step 760). If the spectrophotometer 330 detects a decrease in the intensity of the detected optical emission spectrum of the crystal ("Yes" branch of decision step 760), then the etch process is stopped because the etch process has reached the buried layer 120 (step 770).

Figure 8:
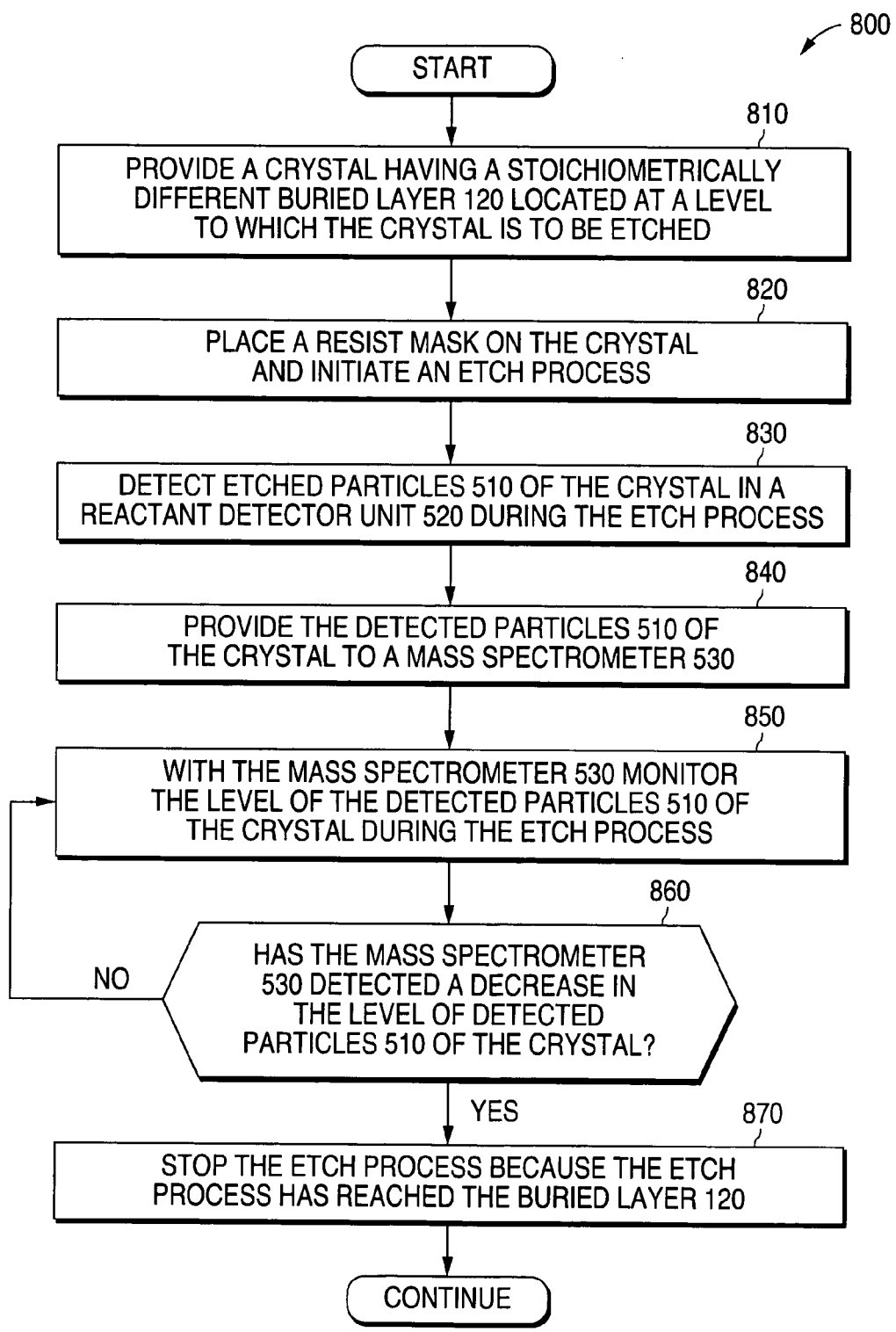
FIG. 8 is a flow chart showing the steps of a second advantageous embodiment of a method of the present invention.

FIG. 8 is a flow chart 800 showing the steps of a second advantageous embodiment of a method of the present invention. In the first step of the method a crystal (e.g., silicon) is provided that has a stoichiometrically different buried layer 120 (e.g., silicon germanium) that is located at a level to which the crystal is to be etched (step 810). Then a resist mask is placed on the crystal and an etch process is initiated (step 820).

During the etch process a reactant detector unit 520 detects particles 510 of the crystal (step 830). The detected particles are provided to a mass spectrometer 530 (step 840). During the etch process the mass spectrometer 530 monitors the level of the detected particles of the crystal (step 850).

If the mass spectrometer 530 detects an unchanged level of the detected particles of the crystal, then the etch process is continued ("No" branch of decision step 860). If the mass spectrometer 530 detects a decrease in the level of the detected particles of the crystal ("Yes" branch of decision step 860), then the etch process is stopped because the etch process has reached the buried layer 120 (step 870).

Although the present invention has been described with several embodiments, various changes and modifications may be suggested to one skilled in the art. It is intended that the present invention encompass such changes and modifications as fall within the scope of the appended claims.

What is claimed is:

1. A method for controlling an etch process that is applied to a crystal material, said method comprising the steps of:

providing a crystal that is made of a first material;

forming a buried layer at a depth in the first material of the crystal at which it is desired to terminate an etch process, the buried layer made of a second material, wherein said second material is stoichiometrically different than said first material, wherein the buried layer is partially made up of a smaller amount of the first material in proportion to a composition of the second material, and wherein the buried layer does not affect the electrical properties of the first material;

applying the etch process to said crystal;

monitoring the etch process using a reactant detector and a mass spectrometer, wherein said reactant detector is used to detect a level of at least one particle that is released during the etch process and the mass spectrometer is used to monitor the level of the at least one particle that is released during the etch process; and determining when said etch process reaches said buried layer.

2. The method as set forth in claim 1 wherein said step of determining when said etch process reaches said buried layer further comprises:

detecting an optical emission spectrum of said first material of said crystal during said etch process;

monitoring an intensity of said optical emission spectrum; and detecting a decrease in said intensity of said optical emission spectrum of said first material when said etch process reaches said second material of said buried layer.

3. The method as set forth in claim 2 further comprising the step of terminating said etch process when said determination is made that said etch process has reached said buried layer.

4. The method as set forth in claim 2 wherein said step of detecting an optical emission spectrum of said first material of said crystal during said etch process comprises the step of:

detecting an optical emission spectrum of said first material with a photodetector.

5. The method as set forth in claim 2 wherein said step of monitoring said intensity of said optical emission spectrum comprises the step of:

monitoring said intensity of said optical emission spectrum with a spectrophotometer.

6. The method as set forth in claim 2 wherein said step of detecting said decrease in said intensity of said optical emission spectrum of said first material when said etch process reaches said second material of said buried layer comprises the step of:

detecting said decrease in said intensity of said optical emission spectrum with a spectrophotometer.

7. The method as set forth in claim 2 wherein said second material of said buried layer of said crystal is one of: silicon germanium, silicon lead and silicon tin.

8. The method as set forth in claim 2 wherein said first material of said crystal is silicon.

9. The method as set forth in claim 8 wherein said second material of said buried layer of said crystal is silicon tin.

10. The method as set forth in claim 2 wherein said step of determining when said etch process reaches said buried layer comprises:

detecting a decrease in said level of said detected particles of said first material when said etch process reaches said second material of said buried layer; and terminating said etch process when a determination is made that said etch process has reached said buried layer.

11. The method as set forth in claim 10 wherein said step of detecting particles of said first material of said crystal during said etch process comprises the step of:

detecting said particles of said first material with the reactant detector unit.

12. The method as set forth in claim 10 wherein said step of monitoring said level of said detected particles of said first material comprises the step of:

monitoring said level of said detected particles with the mass spectrometer.

13. The method as set forth in claim 10 wherein said step of detecting said decrease in said intensity of said level of said detected particles of said first material when said etch process reaches said second material of said buried layer comprises the step of:

detecting said decrease in said level of said detected particles of said first material with the mass spectrometer.

14. The method as set forth in claim 10 wherein said first material of said crystal is silicon, and wherein said second material of said second buried layer of said crystal is one of: silicon germanium, silicon lead and silicon tin.

15. The method as set forth in claim 10 wherein said second material of said buried layer of said crystal does not affect electrical characteristics of other portions of said crystal.

16. A method for controlling an etch process that is applied to a crystal material, said method comprising the steps of:

providing a crystal that is made of a first material having a first buried layer;

forming said second buried layer at a location that is beneath said first buried layer at a depth in said first material of said crystal at which it is desired to terminate an etch process, wherein said first buried layer and said second buried layer are each made of a second material that is stoichiometrically different than said first material;

applying the etch process to said crystal;

monitoring said etch process using a reactant detector and a mass spectrometer, wherein said reactant detector is used to detect a level of at least one particle that is released during the etch process and the mass spectrometer is used to monitor the level of the at least one article that is released during the etch process;

determining when said etch process reaches said second buried layer using said level of at least one particle released during the etch process; and terminating said etch process when a determination is made that said etch process has reached said second buried layer, wherein said determination is based upon a smaller proportion of the first material being detected in said level of at least one particle.

17. The method as set forth in claim 16 wherein said step of determining when said etch process reaches said second buried layer further comprises:

detecting with a photodetector an optical emission spectrum of said first material of said crystal during said etch process;

monitoring with a spectrophotometer an intensity of said optical emission spectrum; and detecting with said spectrophotometer a decrease in said intensity of said optical emission spectrum of said first material when said etch process reaches said second material of said second buried layer.

18. The method as set forth in claim 17 wherein said first material of said crystal is silicon, and wherein said second material of said second buried layer of said crystal is one of: silicon germanium, silicon lead and silicon tin.

19. The method as set forth in claim 16 wherein said step of determining when said etch process reaches said second buried layer comprises:

detecting with the reactant detector unit particles of said first material of said crystal that are released during said etch process;

monitoring with the mass spectrometer a level of said detected particles of said first material; and detecting with said mass spectrometer a decrease in said level of said detected particles of said first material when said etch process reaches said second material of said second buried layer.

20. The method as set forth in claim 19 wherein said first material of said crystal is silicon, and wherein said second material of said second buried layer of said crystal is one of: silicon germanium, silicon lead and silicon tin.

* * * * *